United States Patent
Jang et al.

(10) Patent No.: US 7,486,268 B2
(45) Date of Patent: Feb. 3, 2009

(54) GATE DRIVING APPARATUS AND METHOD FOR LIQUID CRYSTAL DISPLAY

(75) Inventors: Yong Ho Jang, Kyounggi-do (KR); Binn Kim, Seoul (KR); Soo Young Yoon, Kunpo-shi (KR)

(73) Assignee: LG Display Co., Ltd., Seoul (KR)

( * ) Notice: Subject to any disclaimer, the term of this patent is extended or adjusted under 35 U.S.C. 154(b) by 731 days.

(21) Appl. No.: 10/825,616

(22) Filed: Apr. 16, 2004

(65) Prior Publication Data

US 2005/0134545 A1 Jun. 23, 2005

(30) Foreign Application Priority Data

Dec. 17, 2003 (KR) ............... P2003-92694

(51) Int. Cl.
*G09G 3/36* (2006.01)

(52) U.S. Cl. ..................... 345/100

(58) Field of Classification Search ............. 345/100, 345/208, 210; 327/241, 231, 77; 377/64
See application file for complete search history.

(56) References Cited

U.S. PATENT DOCUMENTS

| | | | |
|---|---|---|---|
| 6,670,944 B1 * | 12/2003 | Ishii | 345/100 |
| 6,967,639 B2 * | 11/2005 | Kanzaki et al. | 345/100 |
| 7,106,292 B2 * | 9/2006 | Moon | 345/100 |
| 2003/0128180 A1 * | 7/2003 | Kim et al. | 345/100 |
| 2004/0090412 A1 * | 5/2004 | Jeon et al. | 345/100 |
| 2004/0109526 A1 * | 6/2004 | Park et al. | 377/64 |

FOREIGN PATENT DOCUMENTS

| | | |
|---|---|---|
| JP | 2002-258819 | 9/2002 |
| JP | 2003-141893 | 5/2003 |

OTHER PUBLICATIONS

Communication from Korean Patent Office dated Nov. 29, 2005.

* cited by examiner

*Primary Examiner*—Chanh Nguyen
*Assistant Examiner*—Calvin C Ma
(74) *Attorney, Agent, or Firm*—McKenna Long & Aldridge LLP

(57) ABSTRACT

A gate driving apparatus for a liquid crystal display includes a shift register which is provided with first and second half-period clock signals having phases inverted with respect to each other and each having a pulse width of a half-period, first to fourth one-period clock signals having phases shifted sequentially and each having a pulse width of one period, a start pulse, a high-level supply voltage and a low-level supply voltage. The shift register generates a half-period output in response to the start pulse and the first and second half-period clock signals. The shift register also generates a one-period output at a half-period delay from an end time of the half-period output in response to any one of the first to fourth one-period clock signals.

25 Claims, 12 Drawing Sheets

GATE DRIVING APPARATUS AND METHOD FOR LIQUID CRYSTAL DISPLAY

The present invention claims the benefit of Korean Patent Application No. 92694/2003 filed in Korea on Dec. 17, 2003, which is hereby incorporated by reference.

BACKGROUND OF THE INVENTION

1. Field of the Invention

The present invention relates to a liquid crystal display, and more particularly to a gate driving apparatus and a gate driving method in a liquid crystal display.

2. Discussion of the Related Art

In general, a liquid crystal display (LCD) controls a light transmittance of a liquid crystal using an electric field to thereby display a picture.

FIG. 1 is a schematic view of a configuration of a an active matrix liquid crystal display device in accordance with the related art. Referring to FIG. 1, the active matrix LCD includes a liquid crystal display panel 13. The LCD panel 13 comprises (m×n) liquid crystal cells Clc in a matrix arrangement, m data lines D1 to Dm and n gate lines G1 to Gn intersecting each other. TFT's are provided at the intersections thereof of the data lines and the gate lines. The LCD panel includes a data driving circuit 11 for applying data to the data lines D1 to Dm of the liquid crystal display panel 13. The LCD panel 13 also includes a gate driving circuit 12 for applying a scanning pulse to the gate lines G1 to Gn.

The liquid crystal display panel has liquid crystal molecules injected between two glass substrates. The data lines D1 to Dm and the gate lines G1 to Gn, which cross each other perpendicularly, are provided at the lower glass substrate of the liquid crystal display panel 13. The TFT provided at each intersection between the data lines D1 to Dm and the gate lines G1 to Gn applies a data voltage supplied via the data line D1 to Dn to the liquid crystal cell Clc in response to a scanning pulse from the gate line G1 to Gn. To this end, the gate electrode of the TFT is connected to the gate line G1 to Gn while the drain electrode thereof is connected to the data line D1 to Dm. Further, the source electrode of the TFT is connected to a pixel electrode of the liquid crystal cell Clc.

The upper glass substrate of the liquid crystal display panel 13 is provided with black matrix, color filters and common electrode (not shown). Polarizers having a perpendicular light axis are attached onto the upper and lower glass substrates of the liquid crystal display panel 13, and an alignment film for establishing a free-tilt angle of the liquid crystal is provided at the inner side thereof tangent to the liquid crystal.

The liquid crystal cell Clc of the liquid crystal display panel 13 is provided with a storage capacitor Cst. The storage capacitor Cst is provided between the pixel electrode of the liquid crystal cell Clc and the pre-stage gate line or between the pixel electrode of the liquid crystal cell Clc and a common electrode line (not shown), thereby constantly keeping a voltage of the liquid crystal cell Clc.

The data driving circuit 1 comprises a plurality of data driving integrated circuits. Each of the data driving integrated circuits includes a shift register, a latch, a digital to analog converter and an output buffer. The data driving circuit 11 latches a digital video data, and converts the digital video data to an analog gamma compensation voltage to thereby apply it to the data lines D1 to Dm.

The gate driving circuit 12 comprises a plurality of gate driving integrated circuits. Each of the gate driving integrated circuits includes a shift register for sequentially shifting a start pulse every one horizontal period to generate a scanning pulse, a level shifter for converting an output signal of the shift register to a swing width suitable for a driving of the liquid crystal cell Clc, and an output buffer connected between the level shifter and the gate line G1 to Gn. The gate driving circuit 12 sequentially applies the scanning pulse to the gate lines G1 to Gn to select a horizontal line of the liquid crystal display panel 13 supplied with a data.

FIG. 2 is a waveform diagram of driving signals and data voltages applied to the liquid crystal cells of the liquid crystal display panel in accordance with the related art. In FIG. 2, 'Vd' represents a data voltage outputted by the data driving circuit 11 and applied to the data lines D1 to Dm. 'Vlc' represents a data voltage charged and discharged in and from the liquid crystal cell Clc. Further, 'Scp' represents a scanning pulse generated in one horizontal period. 'Vcom' represents a common voltage applied to the common electrode of the liquid crystal cell Clc.

FIG. 3 is a circuit diagram of a shift register of a gate driving circuit in accordance with the related art. In FIG. 3, the shift register comprises n stages 31 to 3n connected in cascade. A level shifter and an output buffer (not shown) are provided between the stages 31 to 3n and the gate lines G1 to Gn.

In the shift register depicted in FIG. 3, a start pulse SP is inputted to the first stage 21. Output signals g1 to gn−1 from stages 1 to n−1 are inputted as start pulses to the second to nth stages 22 to 2n, respectively. Further, each stage 21 to 2n has the same circuit configuration, and shifts the start pulse SP or the output signals g1 to gn−1 of the previous stage in response to two clock signals of four clock signals C1 to C4, thereby generating a scanning pulse. The generated scanning pulse has a pulse width of one horizontal period.

FIG. 4 is a detailed circuit diagram of a stage circuit configuration of the shift register in accordance with the related art. FIG. 4 depicts a detailed circuit configuration of i-th stage 2i (wherein i is an integer ranging from 1 to n) in the shift register shown in FIG. 3. Stage 2i includes a fifth NMOS transistor T5 for applying a high logical voltage signal to an output node 3i, and a sixth NMOS transistor T6 for applying a low logical voltage signal to an output node 4i.

FIG. 5 is a waveform diagram of input signals of the stage circuit and signals at a control node and an output node in accordance with the related art. An operation of stage 2i will be described in reference to FIG. 4 and FIG. 5.

During a time interval t1, the first and second clock signals C1 and C2 remain at a low logical voltage. The start pulse SP or the output signal gi−1 of the previous stage having a high logical voltage is applied to the gate electrodes of the first and fourth NMOS transistors T1 and T4 to thereby turn on the first and fourth NMOS transistors T1 and T4. A voltage VP1 at a first node P1 is raised to a middle voltage to turn on the fifth NMOS transistor T5, but a voltage Vouti at the output node 3i remains at a low logical voltage because the first clock signal C1 remains at a low logical voltage. A turning-on of the fourth NMOS transistor T4 lowers a voltage at a second node P2 to turn off the second and sixth NMOS transistors T2 and T6, thereby shutting off a discharge path of the first node P1.

During a time interval t2, the first clock signal C1 is inverted to a high logical voltage while the start pulse SP and the output signal gi−1 of the previous stage are inverted to a low logical voltage. The first and fourth NMOS transistors T1 and T4 are turned off. The voltage VP1 at the first node P1 is increased by a voltage charged in a parasitic capacitor between the drain electrode and the gate electrode of the fifth NMOS transistor supplied with a high logical voltage of the first clock signal C1. Thereby, the voltage VP1 is raised beyond a threshold voltage of the fifth NMOS transistor T5.

In other words, the voltage VP1 at the first node P1 becomes higher during time interval t2 than during than time interval t1 due to a bootstrapping effect. Thus, during time interval t2, the fifth NMOS transistor T5 is turned on. The voltage Vouti at the output node 3$i$ is driven by a voltage of the first clock signal C1 supplied by a conduction of the fifth NMOS transistor T3. Consequently, voltage Vouti is inverted to a high logical voltage.

During a time interval t3 interval, the first clock signal C1 is inverted to a low logical voltage. The fifth NMOS transistor T5 remains in an on-state. A voltage Vout at the output node 4$i$ is inverted to a low logic voltage while being discharged via the fifth NMOS transistor T5. Concurrently, a voltage VP1 at the first node P1 is lowered to a middle voltage.

During a time interval t4, the third clock signal C3 is inverted to a high logical voltage. The third NMOS transistor T3 is turned on in response to the third clock signal C3, and a high-level supply voltage VDD is applied, via the third NMOS transistor T3, to the second node P2 to thereby raises a voltage VP2 at the second node P2. The rising voltage VP2 at the second node P2 turns on the sixth NMOS transistor T6 to discharge a voltage Vouti at the output node 3$i$ to a ground voltage VSS. Concurrently, the voltage VP2 turns on the second NMOS transistor T2 to discharge the voltage VP1 at the first node P1 to the ground voltage VSS.

However, the related art LCD has a problem in that it has a high manufacturing cost caused by the multitude of data lines D1 to Dm provided at the liquid crystal display panel 13 and the multitude of driving integrated circuits of the data driving circuit 11 for supplying a data voltage to the data lines D1 to Dm. Such a problem becomes more serious as a resolution goes higher and the liquid crystal display panel 13 has a larger dimension.

SUMMARY OF THE INVENTION

Accordingly, the present invention is directed to a gate driving apparatus and method for liquid crystal display that obviates one of more of the problems due to limitations and disadvantages of the related art.

An object of the present invention is to provide an apparatus for driving a gate of a liquid crystal display having a reduced number of data lines and data driving integrated circuits.

Another object of the present invention is to provide a method for driving a gate of a liquid crystal display having a reduced number of data lines and data driving integrated circuits.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a gate driving apparatus for a liquid crystal display according to one aspect of the present invention includes a shift register provided with first and second half-period clock signals having phases inverted with respect to each other and each having a pulse width of a half-period, first to fourth one-period clock signals having phases shifted sequentially and each having a pulse width of one period, a start pulse, a high-level supply voltage and a low-level supply voltage. The shift register generates a half-period output in response to the start pulse and the first and second half-period clock signals, and generates a one-period output at a half-period delay from an end time of the half-period output in response to any one of the first to fourth one-period clock signals.

In another aspect, the gate driving apparatus for a liquid crystal display includes a first input circuit for charging a first charge control node in response to a start pulse and a first half-period clock signal of first and second half-period clock signals having phases inverted with respect to each other and each having a half-period pulse width, and for charging a first discharge control node in response to the first half-period clock signal and a first clock signal of first to third clock signals having phases shifted sequentially and each having a one-period pulse width. The gate driving apparatus further includes a first output circuit for outputting a half-period output to an output node in response to a control signal from the first charge control node and the second half-period clock signal, and for discharging the output node in response to a control signal from the first discharge control node. The gate driving apparatus also includes a second input circuit for charging a second charge control node in response to the half-period output and the first half-period clock signal, and for charging the second charge control node in response to the second clock signal. The gate driving apparatus further includes a second output circuit for outputting a one-period output to the output node at a half-period delay from an end time of the half-period output in response to a control signal from the second charge control node and the third clock signal, and for discharging the output node in response to a control signal from the second discharge control node.

A gate driving method for a liquid crystal display according to still another aspect of the present invention includes the steps of receiving first and second half-period clock signals having phases inverted with respect each other and each having a half-period of pulse width, first to fourth one-period clock signals having phases shifted sequentially and each having a pulse width of one period, a start pulse, a high-level supply voltage and a low-level supply voltage, and generating a half-period output in response to the start pulse and the first and second half-period clock signals, and generating an one-period output at a half-period delay from the end time of the half-period output in response to any one of the first to fourth one-period clock signals.

A gate driving method for a liquid crystal display according to still another aspect of the present invention includes the steps of charging a first charge control node in response to a start pulse and a first half-period clock signal of first and second half-period clock signals having phases inverted with respect to each other and each having a half-period pulse width, outputting an half-period output to an output node in response to a control signal from the first charge control node and the first half-period clock signal, charging a first discharge control node in response to the second half-period clock signal and a first clock signal of first to third clock signals having phases shifted sequentially and each having an one-period pulse width, discharging the output node in response to a control signal from the first discharge control node, charging the second charge control node in response to the half-period output and the second half-period clock signal, charging the second discharge control node in response to the second clock signal, outputting a one-period output to the output node at a half-period delay from an end time of the half-period output in response to a control signal from the second charge control node and the third clock signal, and discharging the output node in response to a control signal from the second discharge control node.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Figure 1:
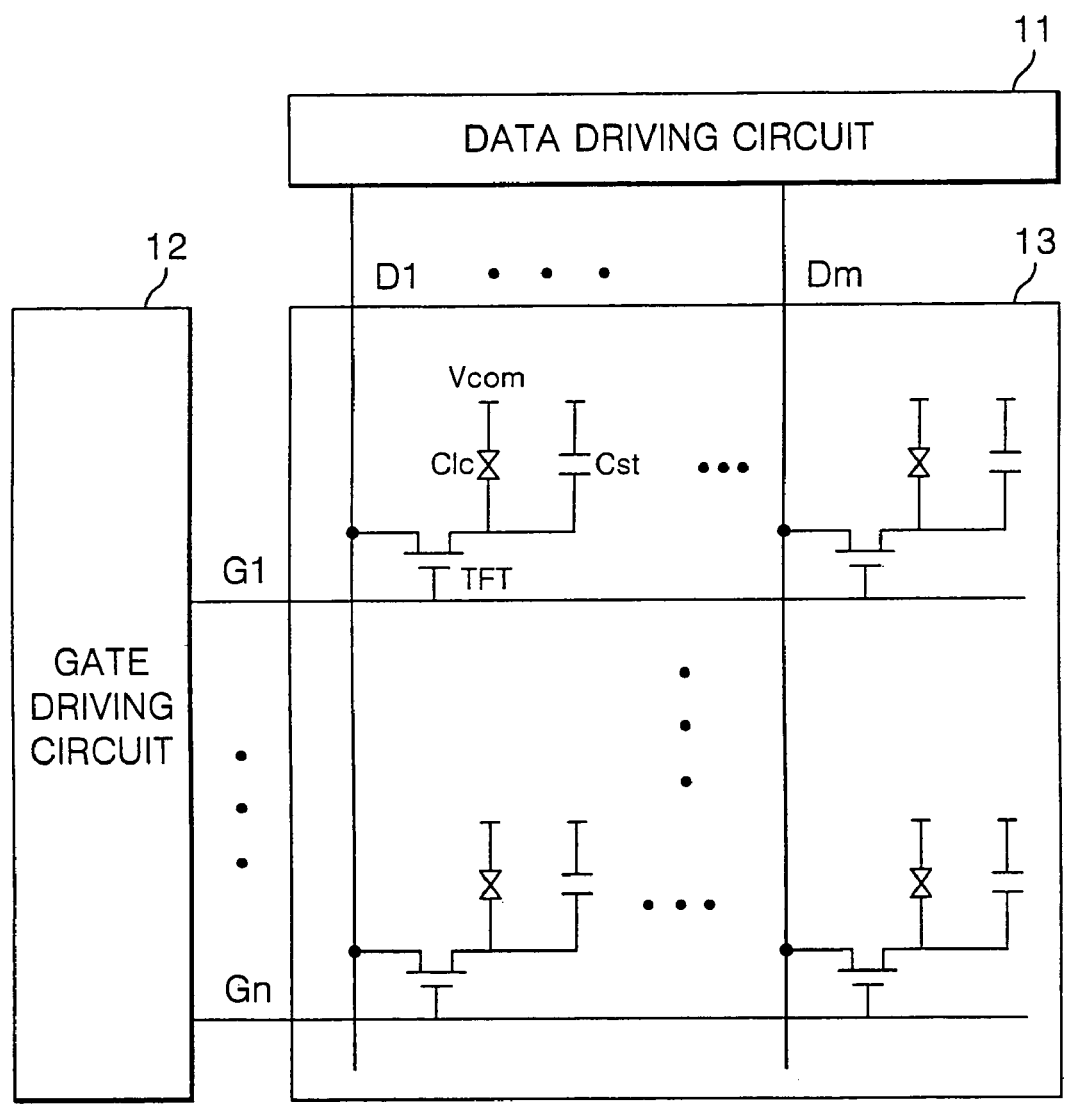
FIG. 1 is a schematic view of a configuration of a an active matrix liquid crystal display device in accordance with the related art.
Figure 2:
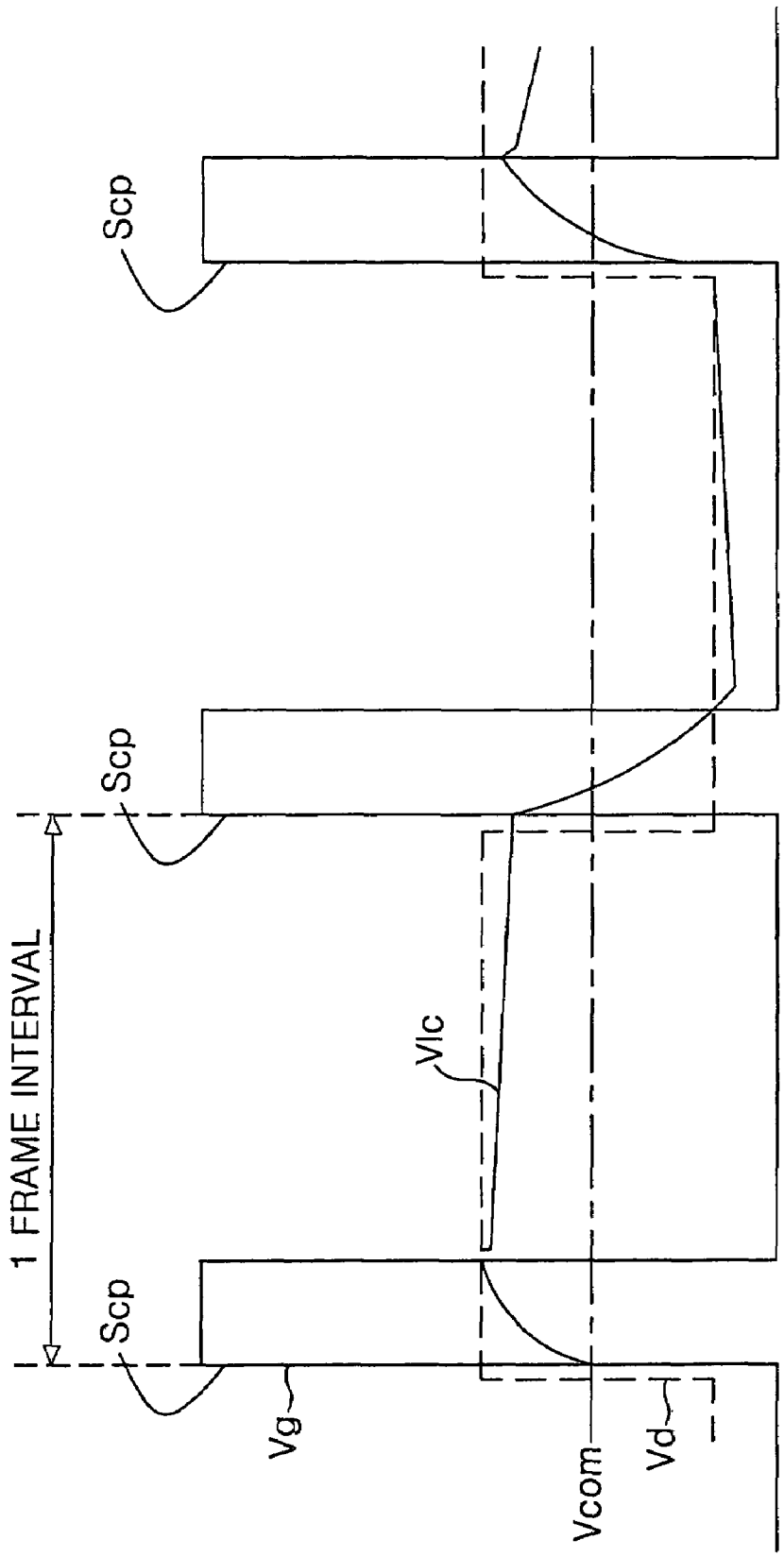
FIG. 2 is a waveform diagram of driving signals and data voltages applied to the liquid crystal cells in the liquid crystal display panel in accordance with the related art.
Figure 3:
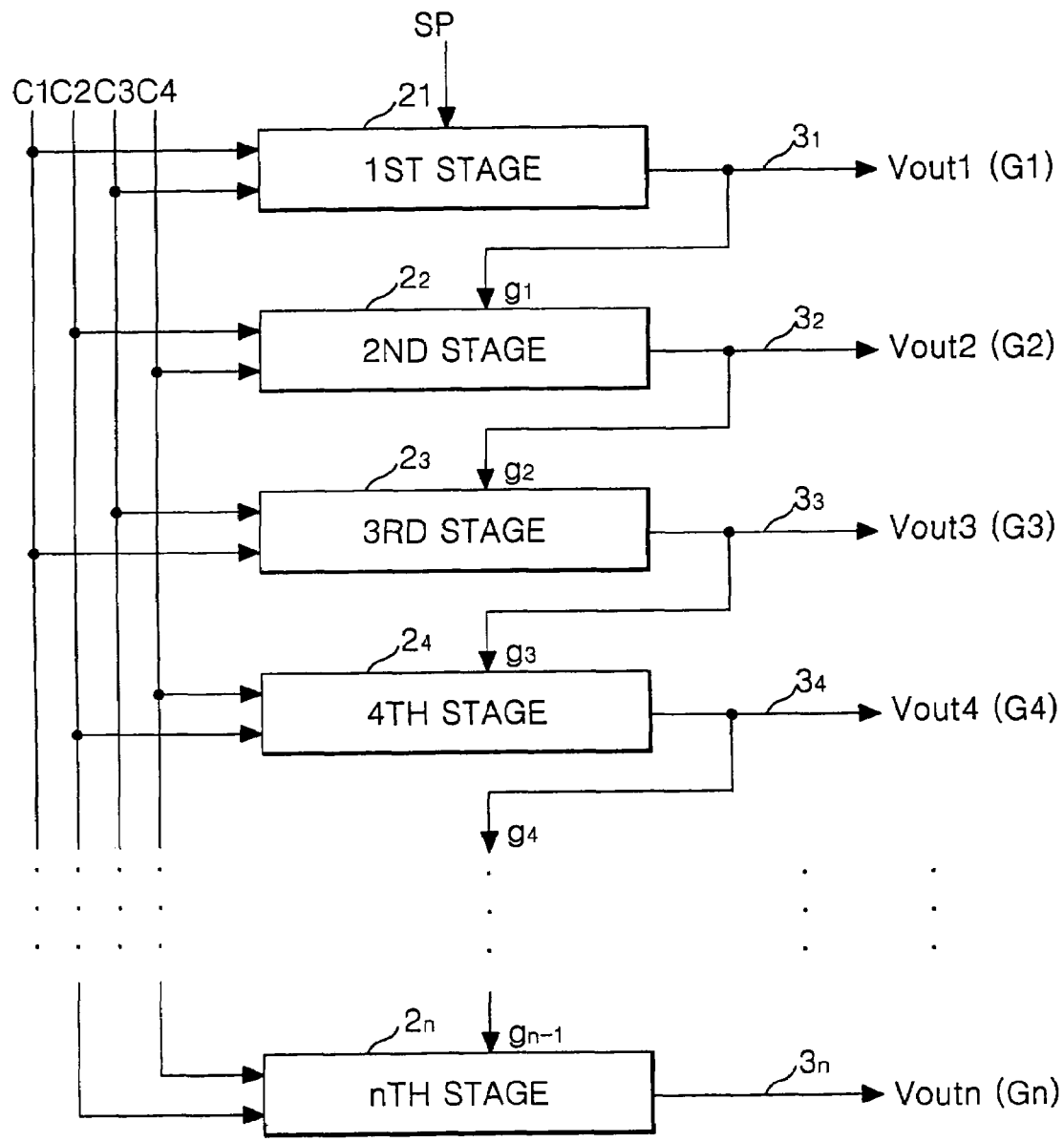
FIG. 3 is a circuit diagram of a shift register of a gate driving circuit in accordance with the related art.
Figure 4:
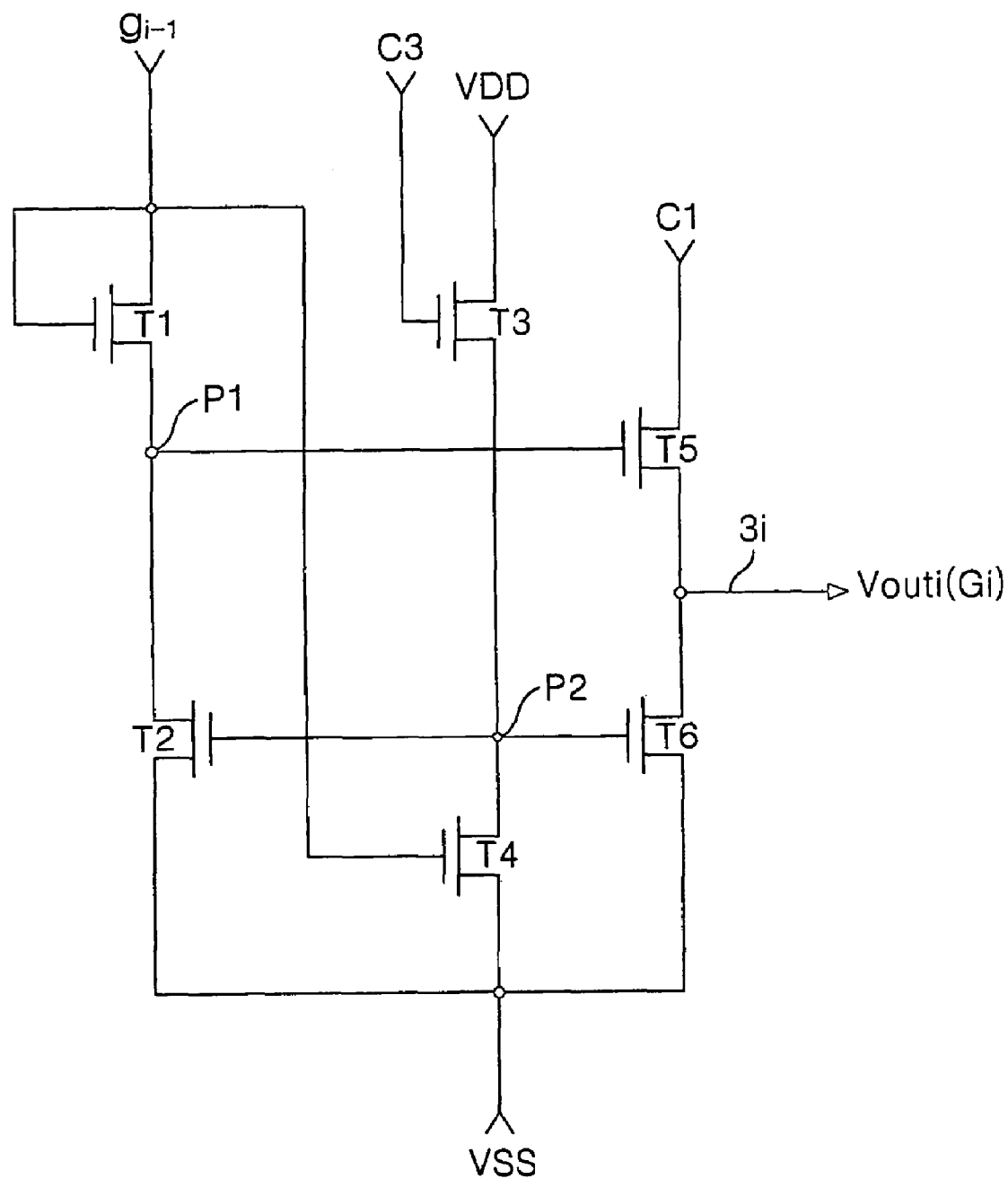
FIG. 4 is a detailed circuit diagram of a stage circuit configuration of the shift register in accordance with the related art.
Figure 5:
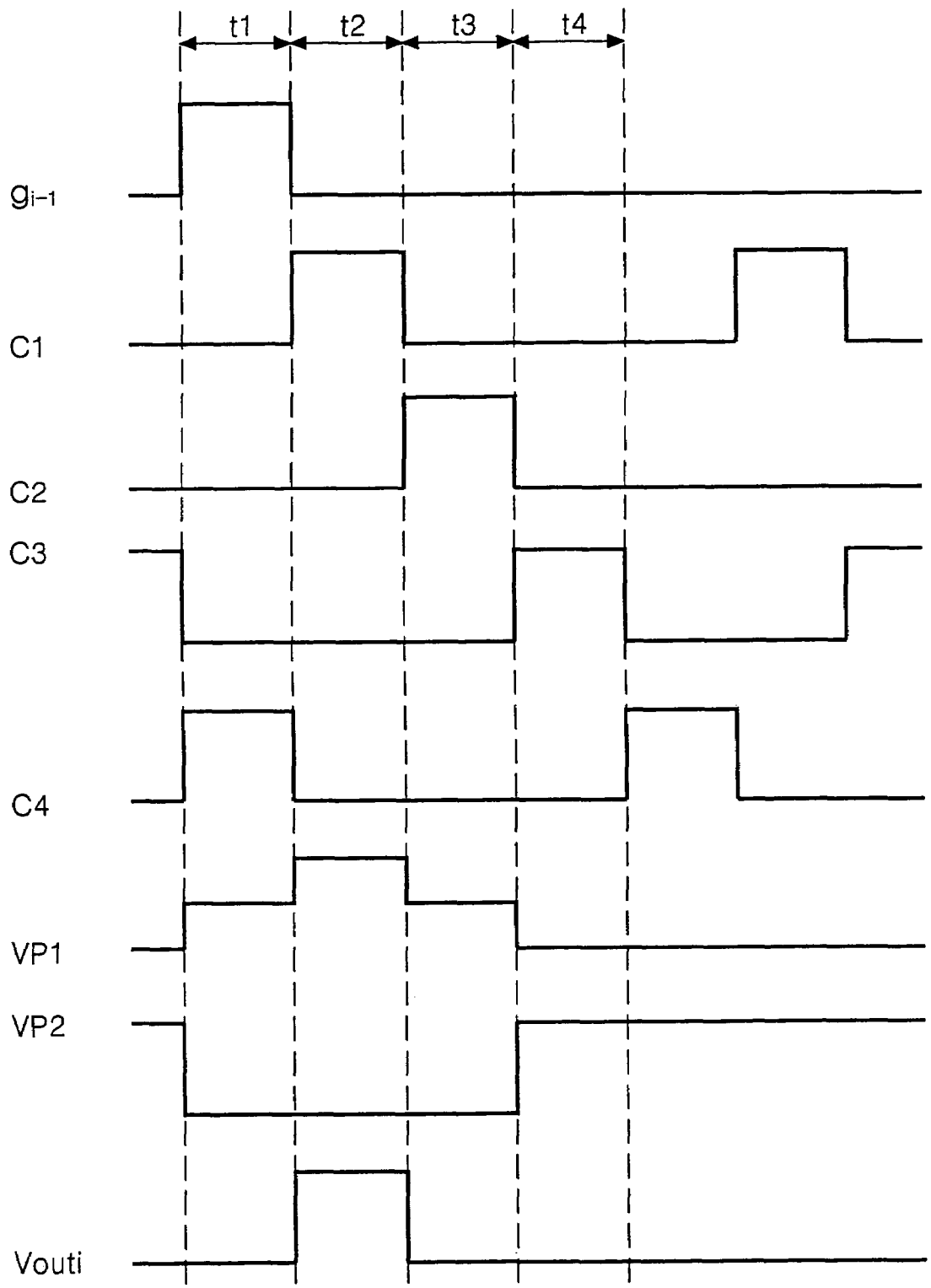
FIG. 5 is a waveform diagram of input signals of the stage circuit and signals at a control node and an output node in accordance with the related art.
Figure 6:
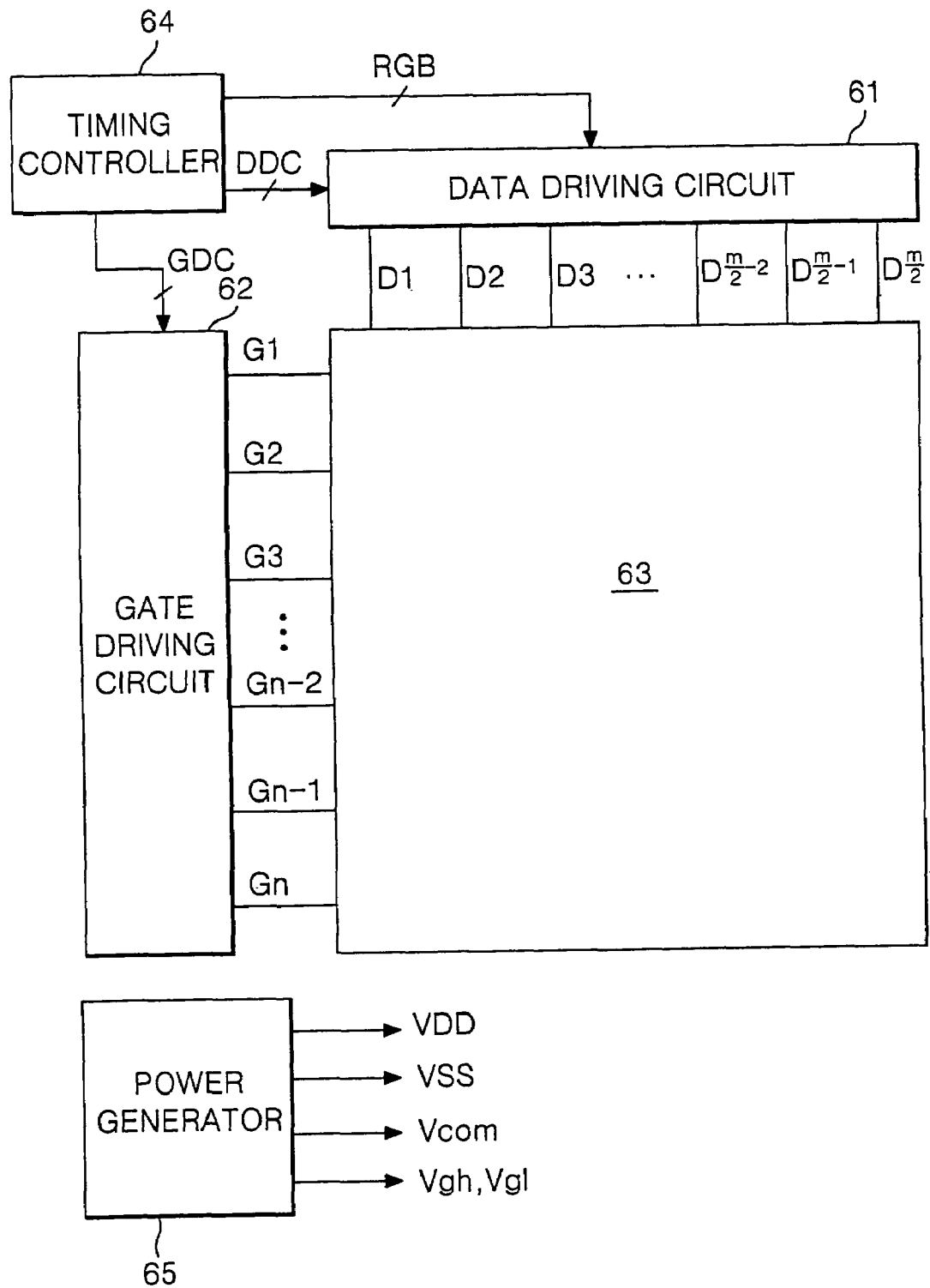
FIG. 6 is an exemplary schematic block diagram of a configuration of a liquid crystal display device according to an embodiment of the present invention.

FIG. 6 is an exemplary schematic block diagram of a configuration of a liquid crystal display device according to an embodiment of the present invention. Referring to FIG. 6, the LCD according to the embodiment of the present invention can include a liquid crystal display panel 63 having (m×n) liquid crystal cells Clc in a matrix arrangement and m/2 data lines D1 to Dm/2 and n gate lines G1 to Gn intersecting each other. The LCD also includes a data driving circuit 61 for applying a data to the data lines D1 to Dm/2 of the liquid crystal display panel 63. A gate driving circuit 62 is provided for applying a scanning pulse to the gate lines G1 to Gn. A timing controller 64 is provided for controlling the data driving circuit 61 and the gate driving circuit 62. A power generator 65 is provided for generating a driving voltage required for a driving of the liquid crystal display panel 63.

Figure 7:
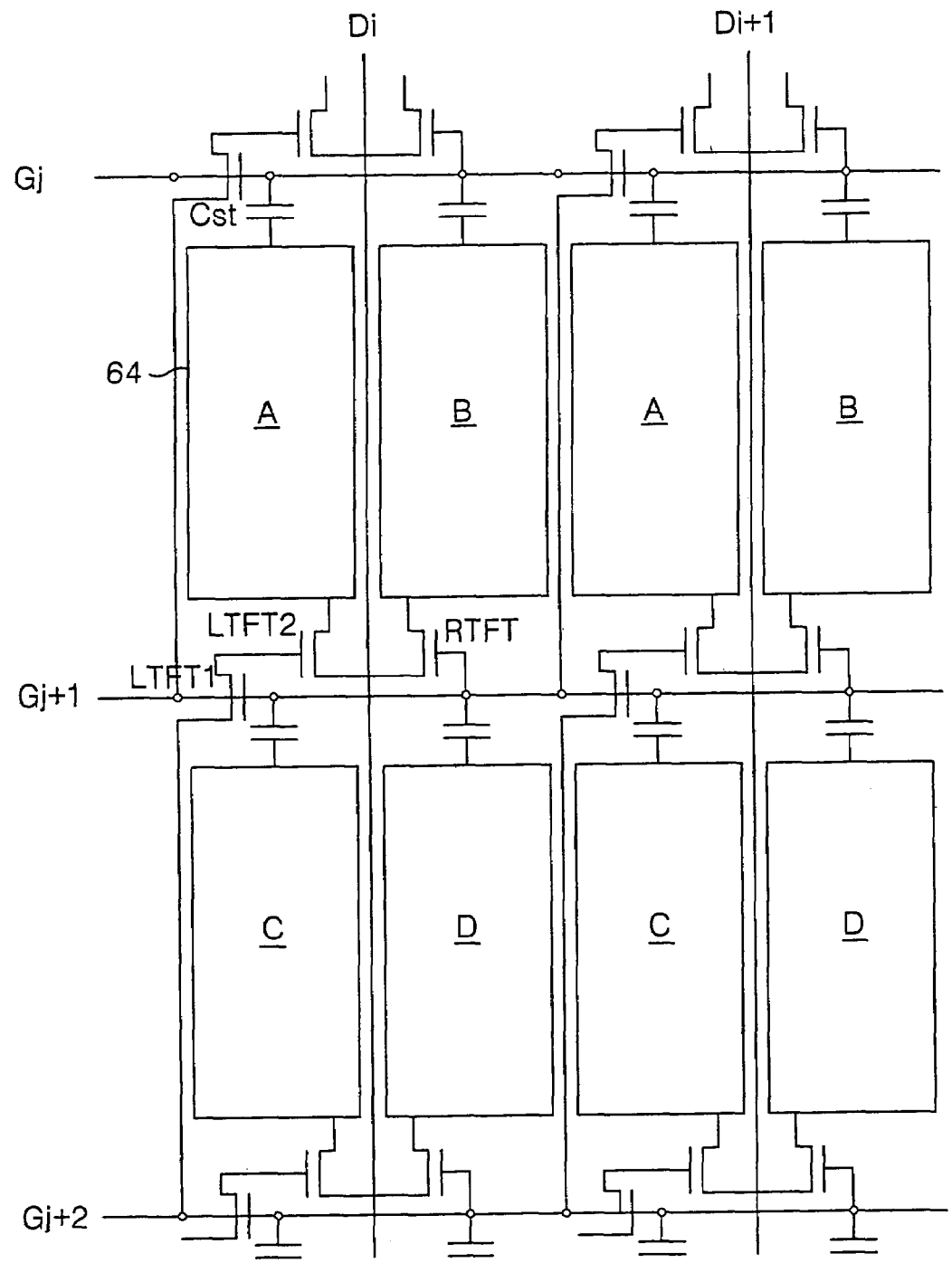
FIG. 7 is an exemplary circuit diagram of a portion of pixel cells in a liquid crystal display panel according to an embodiment of the present invention.

FIG. 7 is an exemplary circuit diagram of a portion of pixel cells in a liquid crystal display panel according to an embodiment of the present invention. The liquid crystal display panel 63 has liquid crystal molecules injected between two glass substrates. The data lines D1 to Dm/2 and the gate lines G1 to Gn provided at the lower glass substrate of the liquid crystal display panel 63 may cross each other perpendicularly. At each crossing between the data lines D1 to Dm/2 and the gate lines G1 to Gn, the LCD can be provided with a first left pixel driving TFT (hereinafter referred to as "LTFT1"), a second left pixel driving TFT (hereinafter referred to as "LTFT2") and a right pixel driving TFT (hereinafter referred to as "RTFT") for distributing a data voltage from the same data line to a left pixel and a right pixel.

The LTFT1 applies a voltage on the (j+1)th gate line Gj+1 (wherein j is an integer smaller than n) to the gate electrode of the LTFT2 in response to a scanning pulse from the j-th gate line Gj to thereby turn off the LTFT2. To this end, the drain electrode of the LTFT1 is connected to the (j+1)th gate line Gj+1. A gate electrode of LTFT1 is connected to the j-th gate line Gj. Further, the source electrode of the LTFT1 is connected to the gate electrode of the LTFT2 for driving the right liquid crystal cell of the i-th data line Di (wherein i is an integer smaller than mn/2).

The LTFT2 forms or shuts off a current path between a pixel electrode 64 of the right liquid crystal cell and the i-th data line Di in response to a control voltage from the source electrode of the LTFT1. To this end, the drain electrode of the LTFT2 is connected to the i-th data line Di while the source electrode thereof is connected to the pixel electrode 64 of the liquid crystal cell positioned at the left side of the i-th data line Di.

The RTFT applies a data voltage to the i-th data line Di in response to a scanning pulse from the j-th gate line Gj. To this end, the drain electrode of the RTFT is connected to the i-th data line. A gate electrode of RTFT is connected to the j-th gate line Gj. Further, the source electrode of the RTFT is connected to the pixel electrode 64 of the liquid crystal cell positioned at the right side of the i-th data line Di.

Each liquid crystal cell of the liquid crystal display panel 63 can be provided with a storage capacitor Cst. The storage capacitor Cst is provided between the pixel electrode of the liquid crystal cell and the pre-stage gate line, thereby constantly keeping a voltage of the liquid crystal cell.

The upper glass substrate of the liquid crystal display panel 63 is provided with a black matrix, color filters and common electrodes (not shown). Polarizers having a perpendicular light axis are respectively attached onto the upper and lower glass substrates of the liquid crystal display panel 63. An alignment film for establishing a free-tilt angle of the liquid crystal can be provided at the inner side thereof tangent to the liquid crystal.

The data driving circuit 61 comprises a plurality of data driving integrated circuits. Each of the data driving integrated circuits includes a shift register, a latch, a digital to analog converter and an output buffer.

The data driving circuit 61 latches a digital video data under control of the timing controller 64, and convert the digital video data to an analog gamma compensation voltage. Thereby, the data driving circuit 61 applies the analog gamma compensation voltage to the data lines D1 to Dm/2.

The data driving circuit 61 can apply different data voltages, via the same data line, to two liquid crystal cells positioned at the left side and the right side of the data line during one horizontal period. To this end, the data driving circuit 61 divides one horizontal periods into two intervals to thereby apply different data voltages to the data lines D1 to Dm/2 every half period.

The gate driving circuit 62 can include a plurality of gate driving integrated circuits. Each of the gate driving integrated circuits can include a shift register. The shift register continuously generates a half-period scanning pulse and a one-period scanning pulse and shifts the generated scanning pulses. The half-period scanning pulse has a pulse width equal to a half (½) of one horizontal period. The one-period scanning pulse has a pulse width of one horizontal period. The half-period and the one-period pulses can have a ½ delay time of one horizontal period therebetween.

The gate driving circuit 62 can further include a level shifter for converting an output signal of the shift register to a swing width suitable for a driving of the liquid crystal cell. The gate driving circuit can also include an output buffer connected between the level shifter and the gate line G1 to Gn.

The gate driving circuit 62 continuously applies the half-period scanning pulse and the one-period scanning pulse to each gate line G1 to Gn under control of the timing controller 64. The gate driving circuit 62 sequentially applies the scanning pulses to the gate lines G1 to Gn, to thereby select an horizontal line of the liquid crystal display panel 63 supplied with a data. Herein, the one-period scanning pulse overlaps with the half-period scanning pulse applied to the next gate line.

Figure 8:
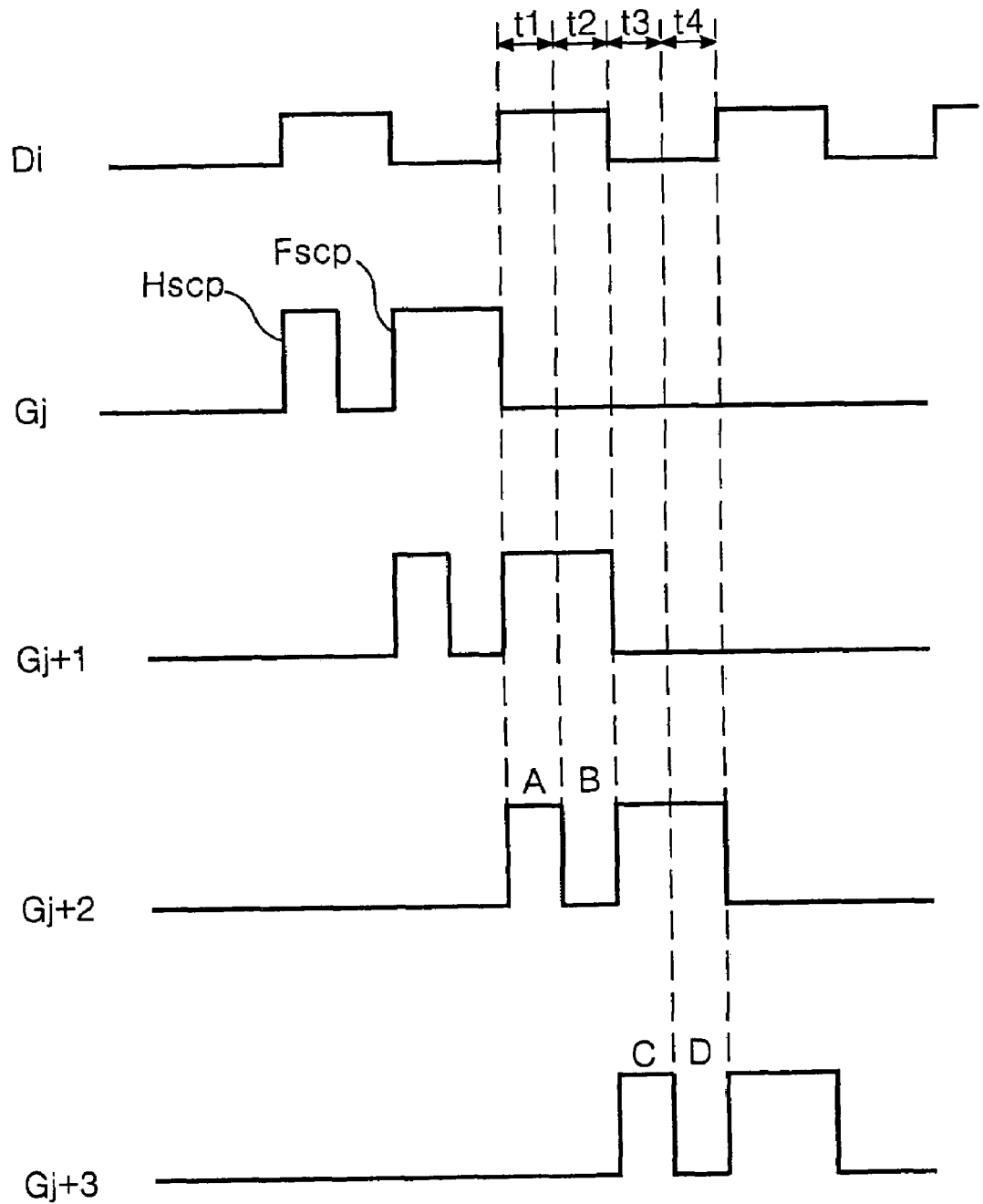
FIG. 8 is an exemplary waveform diagram of an output data voltage of a data driving circuit and an output scanning pulse of a gate driving circuit according to an embodiment of the present invention.

FIG. 8 is an exemplary waveform diagram of an output data voltage of a data driving circuit and an output scanning pulse of a gate driving circuit according to an embodiment of the present invention. As shown in FIG. 8, the j-th gate line Gj is supplied with a half-period scanning pulse HScp. The j-th gate line Gj is supplied with an one-period scanning pulse FScp after a delay time of a half period. An initial ½ pulse width of the one-period scanning pulse FScp overlaps with the half-period scanning pulse HScp applied to the (j+1)th gate line Gj+1.

The timing controller 64 can receive vertical/horizontal synchronizing signals, a clock signal and a data control signal DDC. The timing controller uses the clock signal to generate a gate control signal GDC for controlling the gate driving circuit 62. The timing controller uses the data control signal DDC for controlling the data driving circuit 61. The timing controller 64 samples a digital video data RGB and thereafter re-aligns them to apply the aligned data to the data driving circuit 61.

The gate control signal GDC can include a gate start pulse GSP, a gate shift clock signal GSC, and a gate output enable signal GOE. The gate shift clock signal GSC is used for driving the shift register. The data control signal DDC can include a source start pulse GSP, a source shift clock SSC, a source output enable signal SOC and a polarity signal POL.

The power generator 65 generates driving voltages required for a driving of the liquid crystal display panel 63. The driving voltages include a high-level supply voltage VDD, a ground voltage VSS as a low-level supply voltage, a common voltage Vcom, a gate high voltage Vgh and a gate low voltage Vgl. The common voltage Vcom is a voltage applied to the common electrode opposed to the pixel electrode of the liquid crystal cell. The gate high voltage Vgh is a high logical voltage of the scanning pulse set higher than the threshold voltages of the LTFT1, the LTFT2 and the RTFT. The gate low voltage Vgl is a low logical voltage of the scanning pulse set to an OFF voltage of the TFT.

An operation of the LCD according to the embodiment of the present invention will be described in reference to FIG. 7 and FIG. 8. During a time interval t1, an A pixel voltage is applied to the i-th data line Di and, at the same time, an one-period scanning pulse Fscp is applied to the (j+1)th gate line Gj+1 to thereby turn on the LTFT1, which has a gate electrode connected to the (j+1)th gate line. At the same time, a half-period scanning pulse Hscp is applied to the (j+1)th gate line Gj+1 to turn on the LTFT2 driven by a gate voltage applied via the LTFT1, to thereby charge the A pixel data voltage to the A pixel. Further, during the time interval t1, the RTFT having a gate electrode connected to the (j+1)th gate line Gj+1 is turned on to thereby charge the A pixel data voltage to a B pixel.

During a time interval t2, a B pixel data voltage is applied to the i-th dada line Di and, at the same time, a gate low voltage lower than the TFT threshold voltage is applied to the (j+2)th gate line Gj+2, to thereby turn off the LTFT1, which has a gate electrode connected to the (j+1)th gate line Gj+1. Thus, the A pixel remains at the data voltage while the B pixel charges the B pixel data voltage applied via the RTFT.

The LCD according to this embodiment of the present invention sequentially applies two data voltages via a single of data line to the left/right liquid crystal cells on a time-divisional basis with the aid of the half-period scanning pulse and the one-period scanning pulse. Accordingly, the present embodiment of the instant invention can reduce the number of data lines as well as the number of data driving integrated circuits.

Figure 9:
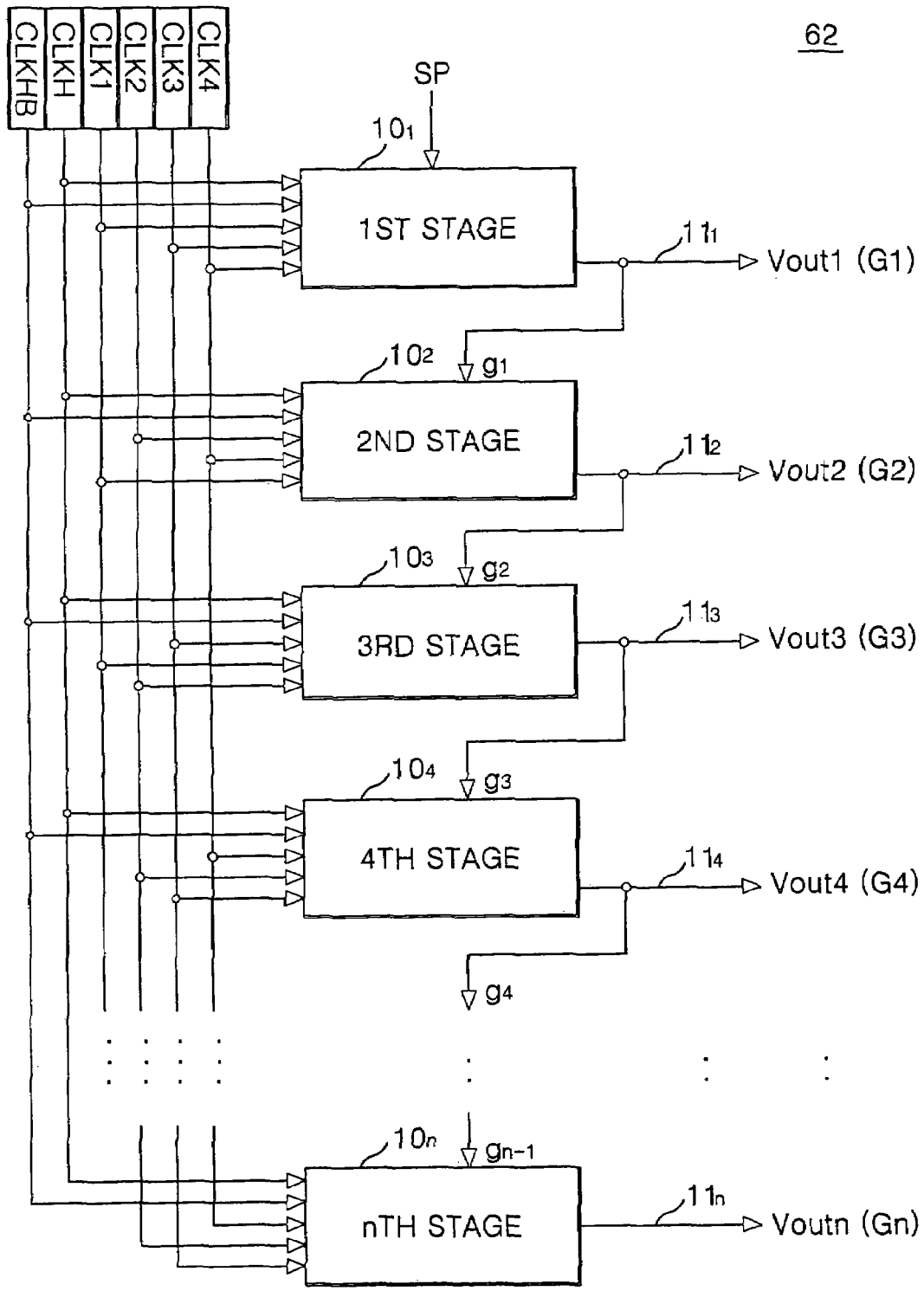
FIG. 9 is a circuit diagram of a shift register for a gate driving circuit according to an embodiment of the present invention.

FIG. 9 is a circuit diagram of a shift register for a gate driving circuit according to an embodiment of the present invention. Referring to FIG. 9, the shift register according to one embodiment of the present invention can include n stages 101 to 10n connected in cascade. A level shifter and an output buffer (not shown) is provided between the stages 101 to 10n and the gate lines G1 to Gn.

In the shift register depicted in FIG. 9, a start pulse SP is inputted to the first stage 101. Output signals g1 to gn−1 of the previous stages are inputted to the second to nth stages 102 to 10n, respectively, as start pulses. Further, each stage 101 to 10n has the same circuit configuration, and generates a half-period scanning pulse Hscp and a one-period scanning pulse Fscp. The stages 101 to 10n generate the scanning pulses in response to three clock signals from first and second half-period clock signals CLKH and CLKHB and from first to fourth clock signals CLK1 to CLK4. Each of CLKH and CLKHB has a pulse width corresponding to a half (½) of one horizontal period. Each of clock signals CLK1 to CLK4 has a pulse width of one horizontal period.

Figure 11:
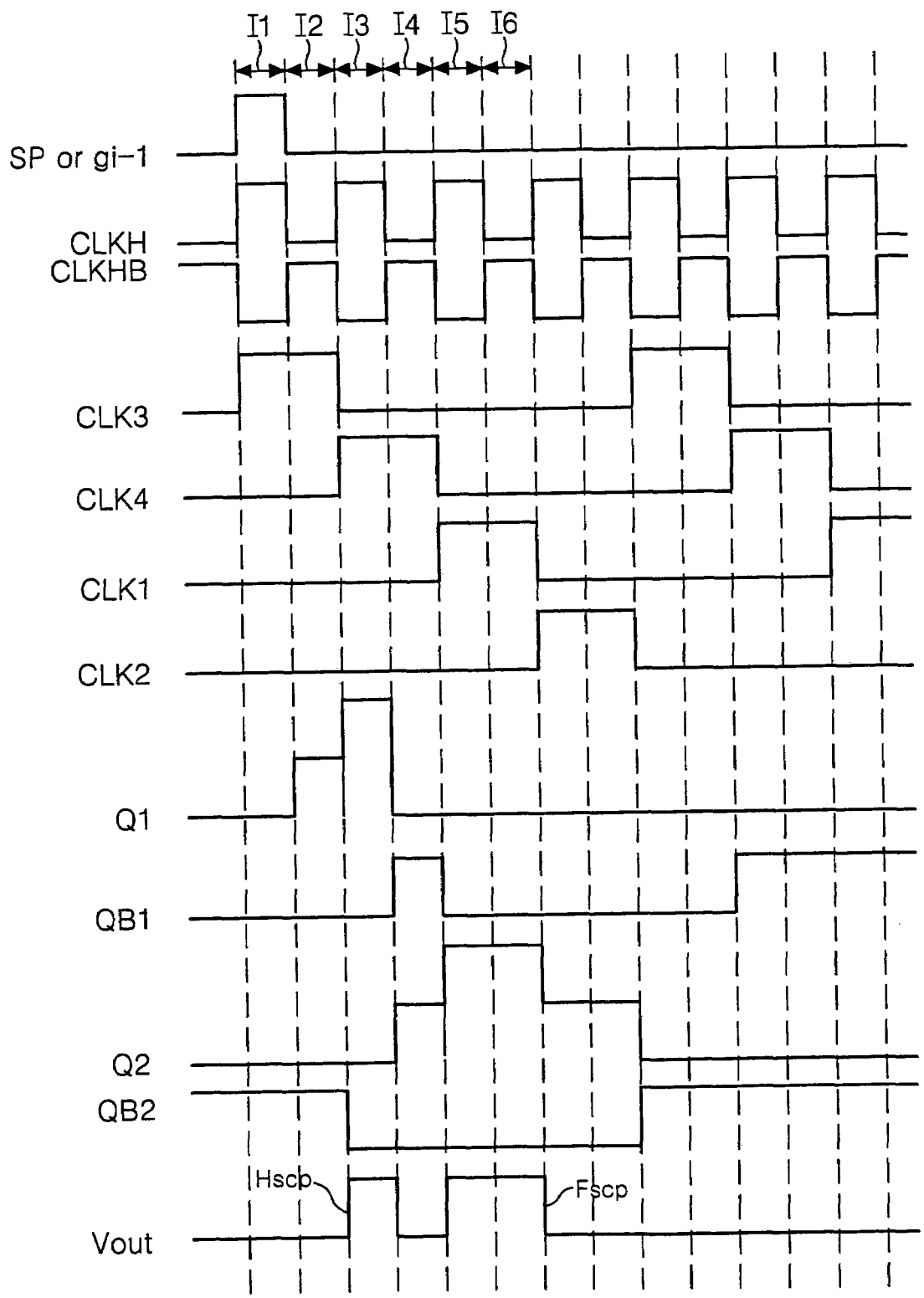
FIG. 11 is an exemplary waveform diagram of input signals to a stage circuit and signals at a control node and an output node in accordance with an embodiment of the present invention.

Herein, the first and second half-period clock signals CLKH and CLKHB have phases inverted with respect to each other every ½ horizontal period as shown in FIG. 11. The start pulse SP has the same pulse width as the first and second half-period clock signals CLKH and CLKHB. The first to fourth clock signals CLK1 to CLK4 are sequentially shifted for each one horizontal period. The start pulse SP, the first half-period clock signal CLKH and the third clock signal CLK3 are synchronized with each other.

Figure 10:
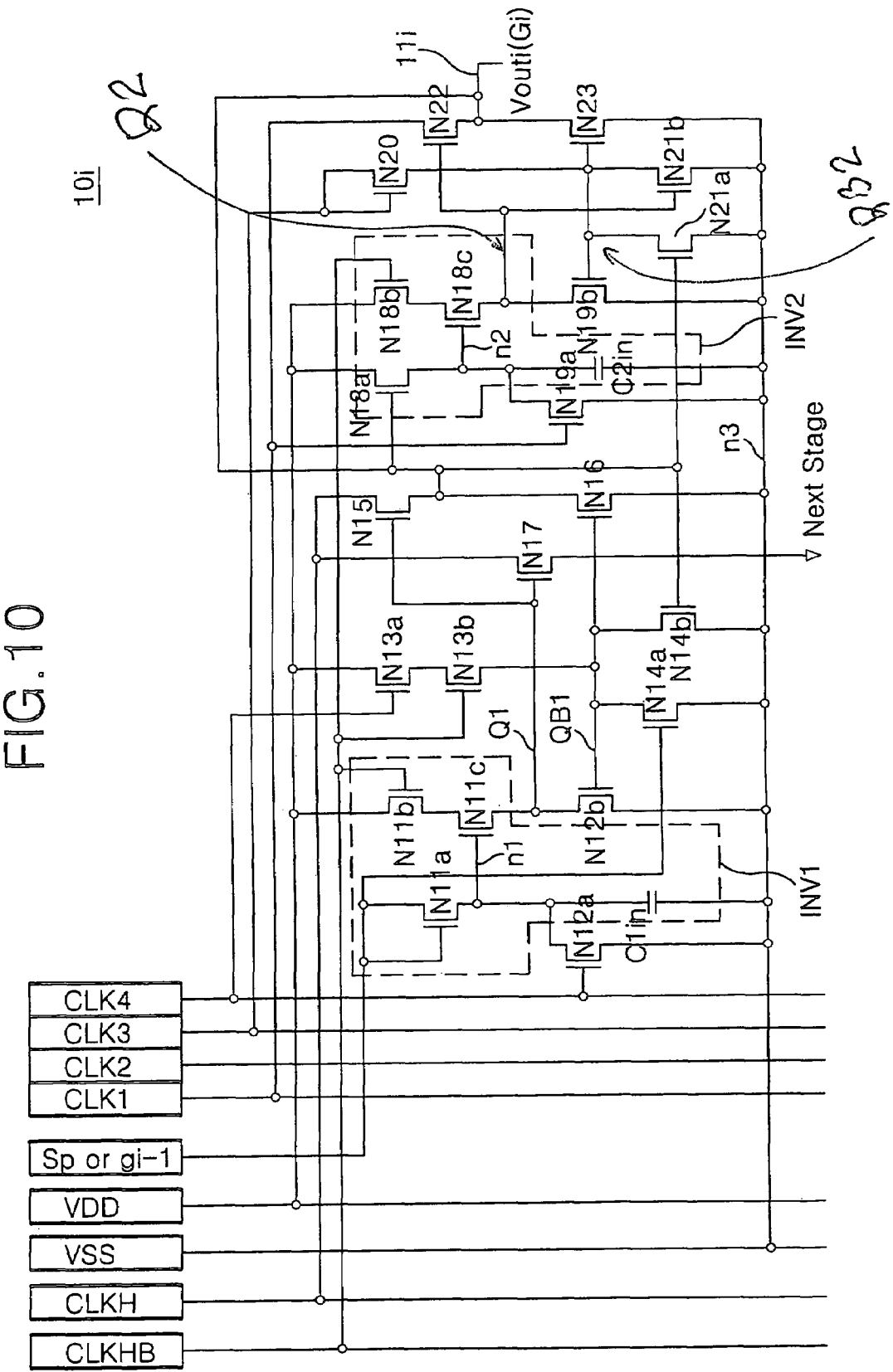
FIG. 10 is an exemplary detailed circuit diagram of a stage circuit configuration for a shift register according to an embodiment of the present invention.

FIG. 10 is an exemplary detailed circuit diagram of a stage circuit configuration for a shift register according to an embodiment of the present invention. Specifically, FIG. 10 depicts an exemplary circuit configuration of the i-th stage 10i in the shift register. The stage 10i includes a first input circuit and a first output circuit for generating the half-period scanning pulse Hscp, and a second input circuit and a second output circuit for generating the one-period scanning pulse Fscp.

Referring to FIG. 10, the first input circuit of the stage 10i charges a first charge control node Q1 in response to the start pulse SP or the output signal of the previous stage and the first and second half-period clock signals CLKH and CLKHB. The first input circuit of the stage 10$i$ also charges a first discharge control node QB1 in response to the second half-period clock signal CLKHB and the fourth clock signal CLK4. The first input circuit includes first NMOS transistors N11$a$, N11$b$ and N11$c$, second NMOS transistors N12$a$ and N12$b$, third NMOS transistors N13$a$ and N13$b$, fourth NMOS transistors N14$a$ and N14$b$ and a first inverter capacitor C1$in$.

The first NMOS transistors N11$a$, N11$b$ and N11$c$ and the first inverter capacitor C1$in$ form a first inverter INV1. The first inverter INV1 charges the first charge control node Q1 at a half-period following the start pulse SP or the output signal gi-1 of the previous stage. The first inverter INV1 charges the first charge control node Q1 in response to the second half-period clock signal CLKHB and one of the start pulse SP or the output signal gi-1 of the previous stage.

The start pulse SP or the output signal gi-1 of the previous stage is applied to the gate electrode and the source electrode of the NMOS transistor N11$a$. The drain electrode of the NMOS transistor N11$a$ is commonly connected to the gate electrode of the NMOS transistor N11$c$, the source electrode of the NMOS transistor N12$a$ and the first inverter capacitor C1$in$. The NMOS transistor N11$a$ acts as a diode applying the start pulse SP or the output signal gi-1 of the previous stage to the gate electrode of the NMOS transistor N11$c$ and the first inverter capacitor C1$in$ when the start pulse SP or the output signal gi-1 of the previous stage is applied thereto.

The gate electrode of the NMOS transistor N11$b$ is supplied with the second half-period clock signal CLKHB while the source electrode thereof is supplied with the high-level supply voltage VDD. The drain electrode of the NMOS transistor N11$b$ is connected to the source electrode of the NMOS transistor N11$c$. The NMOS transistor N11$b$ applies the high-level supply voltage VDD to the source electrode of the NMOS transistor N11$c$ in response to the second half-period clock signal CLKHB.

The start pulse SP or the output signal gi-1 of the previous stage is applied, via the NMOS transistor N11$a$, to the gate electrode of the NMOS transistor N11$c$. The drain electrode of the NMOS transistor N11$c$ is connected to the first charge control node Q1. The NMOS transistor N11$c$ charges the first charge control node Q1 by the high-level supply voltage VDD applied via the NMOS transistor N11$b$ in response to the start pulse SP or the output signal gi-1 of the previous stage.

The first inverter capacitors C1$in$ charges the start pulse SP or the output signal gi-1 of the previous stage applied via the NMOS transistor N11$a$ to thereby constantly keep a gate voltage of the NMOS transistor N11$c$ when the NMOS transistor N11$a$ is turned off.

The gate electrode of the NMOS transistor N2$a$ is supplied with the fourth clock signal CLK4 while the drain electrode thereof is supplied with the ground voltage VSS. The source electrode of the NMOS transistor N12$a$ is connected to the drain electrode of the NMOS transistor N11$a$, the gate electrode of the NMOS transistor N11$c$ and the first inverter capacitor C1$in$. The NMOS transistor N12$a$ discharges a gate voltage of the NMOS transistor N11$c$ and a voltage at the first inverter capacitor C1$in$ in response to the fourth clock signal CLK4.

The drain electrode of the NMOS transistor N12$b$ is supplied with the ground voltage VSS. The gate electrode of the NMOS transistor N12$b$ is connected to a first discharge control node QB1 while the source electrode thereof is connected to the drain electrode of the NMOS transistor N11$c$ and the first charge control node Q1. The NMOS transistor N12$b$ is turned on when the first discharge control node QB1 is charged to thereby discharge the first charge control node Q1.

The gate electrode of the NMOS transistor N13$a$ is supplied with the fourth clock signal CLK4 while the source electrode thereof is supplied with the high-level supply voltage VDD. The drain electrode of the NMOS transistor N13$a$ is connected to the source electrode of the NMOS transistor N13$b$. The NMOS transistor N13$a$ applies the high-level supply voltage VDD to the source electrode of the NMOS transistor N13$b$ in response to the fourth clock signal CLK4.

The gate electrode of the NMOS transistor N13$b$ is supplied with the second half-period clock signal CLKHB. The drain electrode of the NMOS transistor N13$b$ is connected to the first discharge control node QB1. The NMOS transistor N13$b$ applies the high-level supply voltage VDD from the NMOS transistor N13$a$ to the first discharge control node QB1 in response to the second half-period clock signal CLKHB to thereby charge the first discharge control node QB1.

The gate electrode of the NMOS transistor N14$a$ is supplied with the start pulse SP or the output signal gi-1 the previous stage while the drain electrode thereof is supplied with the ground voltage VSS. The source electrode of the NMOS transistor N14$a$ is connected to the first discharge control node QB1. The NMOS transistor N14$a$ discharges the first discharge control node QB1 in response to the start pulse SP or the output signal gi-1 of the previous stage.

The drain electrode of the NMOS transistor N14$b$ is supplied with the ground voltage VSS. The gate electrode of the NMOS transistor N14$b$ is connected to an output node 11$i$ while the source electrode thereof is connected to the first discharge control node QB1. The NMOS transistor N14$b$ discharges the first discharge control node QB1 in response to an output voltage Vout(i) at the output node 11$i$.

Still referring to FIG. 10, the first output circuit of the stage 10$i$ generates the half-period scanning pulse Hscp and a start pulse of the next stage in response to a control voltage at the first charge control node Q1 and the first half-period clock signal CLKH. The first output circuit of the stage 10$i$ also discharges a voltage at the output node 11$i$ in response to a control voltage at the first discharge control node QB1. The first output circuit includes a fifth NMOS transistor N15, a sixth NMOS transistor N16 and a seventh NMOS transistor N17.

The gate electrode of the fifth NMOS transistor N15 is supplied with a voltage at the first charge control node Q1 while the source electrode thereof is supplied with the first half-period clock-signal CLKH. The drain electrode of the fifth NMOS transistor N15 is connected to the output node 11$i$. The fifth NMOS transistor N15 acts as a buffer transistor for outputting the half-period scanning pulse Hscp via the output node 11$i$ in response to a control voltage at the first charge control node Q1.

The gate electrode of the sixth NMOS transistor N16 is supplied with a voltage at the first discharge control node QB1 while the drain electrode thereof is supplied with the ground voltage VSS. The source electrode of the sixth NMOS transistor N16 is connected to the output node 11$i$. The sixth NMOS transistor N16 keeps a voltage at the output node 11$i$ at the ground voltage VSS in response to a control voltage at the first discharge control node QB1. In other words, the sixth NMOS transistor N16 forms a current path between the output node 11$i$ and a ground voltage node n3 during the first half-period clock signal CLKH following generation of an output voltage, thereby keeping the output node 11$i$ at an OFF state.

The gate electrode of the seventh NMOS transistor N17 is supplied with a voltage at the first charge control node Q1 while the source electrode thereof is supplied with the first half-period clock signal CLKH. The drain electrode of the NMOS transistor N17 is connected to a start pulse input terminal of the next stage (not shown). The seventh NMOS transistor N17 applies the first half-period clock signal CLKH to the start pulse input terminal of the next stage as a start pulse gi of the next stage in response to a control voltage at the first charge control node Q1.

Still referring to FIG. 10, the second input circuit of the stage 10i is driven with the half-period scanning pulse Hscp from the first output circuit to charge a second charge control node Q2, thereby generating the one-period scanning pulse Fscp. The second input circuit includes eighth NMOS transistors N18a, N18b and N18c, ninth NMOS transistors N18b and N18c, a tenth NMOS transistor N20, eleventh NMOS transistors N21a and N21b, and a second inverter capacitor C2in.

The NMOS transistors N18a, N18b and N18c, and the second inverter capacitor C2in form a second inverter INV2 for charging a second charge control node Q2 after a delay of a half-period following the output voltage Vout(i) in response to the output voltage Vout(i) at the output node 11i and the second half-period clock signal CLKHB.

The gate electrode of the NMOS transistor N18a is supplied with the output voltage Vout(i) while the source electrode thereof is supplied with the high-level supply voltage VDD. The drain electrode of the NMOS transistor N18a is commonly connected to the gate electrode of the NMOS transistor N18c, the source electrode of the NMOS transistor N19a and the second inverter capacitor C2in. The NMOS transistor N11a applies the high-level supply voltage VDD to the gate electrode of the NMOS transistor N18c and the second inverter capacitor C2in in response to the half-period scanning pulse Hscp.

The gate electrode of the NMOS transistor N18b is driven by the second half-period clock signal CLKHB while the source electrode thereof is supplied with the high-level supply voltage VDD. The drain electrode of the NMOS transistor N18b is connected to the source electrode of the NMOS transistor N18c. The NMOS transistor N18b applies the high-level supply voltage VDD to the source electrode of the NMOS transistor N18c in response to the second half-period clock signal CLKHB.

The high-level supply voltage is applied, via the NMOS transistor N18a, to the gate electrode of the NMOS transistor N18c. The drain electrode of the NMOS transistor N18c charges the second charge control node Q2 by the high-level supply voltage VDD applied via the NMOS transistor N18b in response to the high-level supply voltage VDD during an ON time of the NMOS transistor N18a.

The second inverter capacitor C2in charges the high-level supply voltage VDD applied via the NMOS transistor N18a to thereby keep constant a gate voltage of the NMOS transistor N18c when the NMOS transistor N18a is turned off.

The gate electrode of the NMOS transistor N19a is driven by the first clock signal CLK1 while the drain electrode thereof is supplied with the ground voltage VSS. The source electrode of the NMOS transistor N19a is connected to the drain electrode of the NMOS transistor N18a, the gate electrode of the NMOS transistor N18c and the second inverter capacitor C2in. The NMOS transistor N19a discharges a gate voltage of the NMOS transistor N18c and a voltage at the second inverter capacitor C2in in response to the first clock signal CLK1.

The drain electrode of the NMOS transistor N19b is supplied with the ground voltage VSS. The gate electrode of the NMOS transistor N19b is connected to the second discharge control node QB2 while the source electrode thereof is connected to the drain electrode of the NMOS transistor N18c and the second charge control node Q2. The NMOS transistor N19b is turned on when the second discharge control node QB2 is charged, thereby discharging the second charge control node Q2.

The gate electrode and the source electrode of the tenth NMOS transistor N20 are driven by the third clock signal CLK3. The drain electrode of the tenth NMOS transistor N20 is connected to the second discharge control node QB2 and the source electrode of the NMOS transistor N21b. The NMOS transistor N20 charges the second discharge control node QB2 in response to the third clock signal CLK3.

The drain electrode of the NMOS transistor N21a is supplied with the ground voltage VSS. The gate electrode of the NMOS transistor N21a is connected to the output node 11i and the gate electrode of the NMOS transistor N14b while the source electrode thereof is connected to the second discharge control node QB2. The NMOS transistor N21b is turned on when a voltage is charged in the output node 11i to charge the second discharge control node QB2, thereby turning on the NMOS transistor N19b and the NMOS transistor N23.

The drain electrode of the NMOS transistor N21b is supplied with the ground voltage VSS. The gate electrode of the NMOS transistor N21b is connected to the second charge control node Q2 while the source electrode thereof is connected to the second discharge control node QB2. The NMOS transistor N21b is turned on when the second charge control node Q2 is charged, thereby discharging the second discharge control node QB2, and turning off the NMOS transistor N19b and the NMOS transistor N23.

Still referring to FIG. 10, the second output circuit of the stage 10i generates the one-period scanning pulse Fscp in response to a control voltage at the second charge control node Q2, and discharges a voltage at the output node 11i in response to a control voltage at the second discharge control node QB21. The second output circuit includes the twelfth NMOS transistor N22 and the thirteenth NMOS transistor N23.

The gate electrode of the NMOS transistor N22 is supplied with a voltage at the second charge control node Q2 while the source electrode thereof is supplied with the first clock signal CLK1. The drain electrode of the NMOS transistor N22 is connected to the output node 11i. The NMOS transistor N22 acts as a buffer transistor for outputting the one-period scanning pulse Fscp via the output node 11i in response to a control voltage at the second charge control node Q2.

The gate electrode of the NMOS transistor N23 is supplied with a voltage at the second discharge control node QB2 while the drain electrode thereof is supplied with the ground voltage VSS. The source electrode of the NMOS transistor N23 is connected to the output node 11i. The NMOS transistor N23 keeps a voltage at the output node 11i at the ground voltage VSS in response to a control voltage at the second discharge control node QB2 after generating an output voltage at the output node 11i. Further, the NMOS transistor N23 forms a current path between the output node 11i and the ground voltage node n3 when the first clock signal CLK1 is inverted to a low logic after generating an output voltage, thereby keeping the output node 11i at an OFF state.

FIG. 11 is an exemplary waveform diagram of input signals to a stage circuit and signals at a control node and an output node in accordance with an embodiment of the present invention. Referring to FIG. 10 and FIG. 11, during a time interval I1 when the start pulse SP or the output signal gi−1 of the previous stage has a high logical voltage, the first half-period clock signal CLKH and the third clock signal CLK3 have a high logical voltage while the first, second and fourth clock signals CLK1, CLK2 and CLK4 have a low logical voltage. During the time interval I1, the NMOS transistors N11a and N11c are turned on by the start pulse SP or the output signal gi−1 of the previous stage. A voltage of the start pulse SP or the output signal gi−1 of the previous stage is charged in the first inverter capacitor C1in. At the same time, the NMOS transistor N14a is turned on in response to the start pulse SP or the output signal gi−1 of the previous stage applied via the NMOS transistor N11a, thereby keeping a voltage at the first discharge control node QB1 at the ground voltage VSS. Further, during the time interval I1, the tenth NMOS transistor N20 is turned on in response to the third clock signal CLK3 to thereby charge the second discharge control node QB1. At this time, the NMOS transistors N19a and N23 are turned on to thereby keep a voltage at the output node 11i at the ground voltage VSS.

During a time interval I2, the third clock signal CLK3 remains at a high logical voltage. The first half-period clock signal CLKH and the start pulse SP or the output signal gi−1 of the previous stage are inverted to a low logical voltage. Also, the NMOS transistors N11a and N14 are turned off while the NMOS transistor N11b is turned on in response to the second half-period clock signal CLKHB.

The first charge control node Q1 is charged to a middle voltage by the high-level supply voltage VDD applied via the NMOS transistor N11c that keeps an ON state by voltages charged in the NMOS transistor N11b and the first inverter capacitor C1in. The second discharge control node QB2 keeps the ground voltage VSS because the third clock signal CLK3 has a high logical voltage.

During a time interval I3, the third clock signal CLK3 is inverted to a low logical voltage while the fourth clock signal CLK4 is inverted to a high logical voltage. Concurrently, phases of the first and second half-period clock signals CLKH and CLKHB are inverted again with respect to each other. A voltage at the first charge control node Q1 is increased to that of a gate-source parasitic capacitance voltage of the seventh NMOS transistor N17 charged by the first half-period clock signal CLKH. Thus, the voltage at the first charge control node Q1 becomes higher than the threshold voltage of the NMOS transistor due to a bootstrapping effect.

The first half-period clock signal CLKH is applied, via the seventh NMOS transistor N17, to the start pulse input terminal of the next stage as a start pulse. At this time, the fifth NMOS transistor N15 turned on by the first half-period clock signal CLKH allows the first half-period clock signal CLKH to be outputted as the half-period scanning pulse Hscp via the output node 11i. At the same time, the NMOS transistors N14b and N21a connected to the output node 11i are turned on, thereby keeping the first discharge control node QB1 at the ground voltage VSS and discharging the second discharge control node QB2 to the ground voltage VSS. Further, during the time interval I3, as the NMOS transistor N18a is turned on by the half-period scanning pulse Hscp at the output node 14i, a gate voltage of the NMOS transistor N18c is charged in the second inverter capacitor C2in.

During a time interval I4, the fourth clock signal CLK4 remains at a high logical voltage, and the phases of the first and second half-period clock signals CLKH and CLKHB are inverted again with respect to each other. At this time, the NMOS transistor N13a remains ON due to the fourth clock signal CLK4. The NMOS transistor N13b is turned on by the second half-period clock signal CLKHB. As a result, the first discharge control node QB1 charges the high-level supply voltage VDFD to turn on the NMOS transistors N12b and N16, thereby discharging the first charge control node Q1 and the output node 11i.

During the time interval I4, the second charge control node Q2 is charged by the high-level supply voltage VDD, which is applied via the NMOS transistor N18c. NMOS transistor N18c remains ON due to voltages charged in the NMOS transistor N18b and the second inverter capacitor C2in. Transistor N18b is turned on by the second half-period signal CLKHB. Thereby, the second charge control node Q2 is raised to a middle voltage.

During a I5 interval, the fourth clock signal CLK4 is inverted to a low logical voltage while the first clock signal CLk1 is inverted to a high logical value. Phases of the first and second half-period clock signals CLKH and CLKHB are again inverted with respect to each other. A voltage at the second charge control node Q2 increases to that of a gate-source parasitic capacitance voltage of the NMOS transistor N22 charged by the first clock signal CLK1. Specifically, the voltage at the second charge control node becomes higher than the threshold voltage of the NMOS transistor due to a bootstrapping effect. The first clock signal CLK1 raises a voltage at the output node 11i via the NMOS transistor N22 turned on by the first clock signal CLK1. At this time, the one-period scanning pulse Fscp is outputted via the output node 11a. Concurrently, the NMOS transistors N14b and N21a connected to the output node 11i are turned on, thereby keeping the second discharge control node QB1 at the ground voltage VSS, and discharging the first discharge control node QB1 to the ground voltage VSS.

During a I6 interval, the first clock signal CLK1 remains at a high logical value. Phases of the first and second clock signals CLKH and CLKHB are again inverted with respect to each other. At this time, the second charge control node Q2 remains in a bootstrapping state due to the first clock signal CLK1, thereby continuously outputting the one-period scanning pulse Fscp via the output node 11i. During the I6 period, since the output node 11i remains at a high logical voltage, the first and second discharge control nodes QB1 and QB2 remains at the ground voltage VSS.

Referring to FIGS. 9-11, if the start pulse SP or the output signal gi−1 of the previous stage of the shift register is inputted to the start pulse input terminal, then the first charge control node Q1 is charged after a half-period delay by the first inverter INV1. Specifically, if the start pulse SP or the output signal gi−1 of the previous stage is inputted to the start pulse input terminal, then the first charge control node Q1 is turned on when the NMOS transistor N11c of the first inverter INV1 is turned on, and then the second half-period clock signal CLKH is inverted to a high logical voltage.

If the first half-period clock signal CLKH is inverted to a high logical voltage in such a charged state of the first charge control node Q1, then the fifth NMOS transistor N15 is turned on, and a half-period output signal is outputted via the output node 11i without any loss because of bootstrapping. At this time, the half-period output signal acts as a start pulse for the second inverter INV2 to enable charging of the second charge control node Q2 and the next stage by the NMOS transistor N17.

The output node 11i is connected with four transistors such as the NMOS transistors N15, N16, N22 and N23. Accordingly, upon generation of the output signal, the remaining nodes excluding the first charge control node Q1 should remain at a ground state. The remaining nodes include the second charge control node Q2, the first discharge control node QB1 and the second discharge control node QB2. If any other control nodes has been charged, then an output voltage is reduced due to the charged node.

The half-period output turns on the NMOS transistor N18c of the second inverter INV2. The second charge control node Q2 is charged when the second half-period clock signal CLKHB is applied again. At the same time, the fourth clock signal Q1, which overlaps periodically with the second half-period clock signal CLKHB, charges the first discharge control node QB1 to thereby discharge the first charge control node Q1. Further, if the first clock signal CLK1 is applied, then a one-period output is generated by the bootstrapping of the second charge control node Q2.

After the generation of one-period output, the third clock signal CLK3 charges the second discharge control node QB2 to thereby discharge the second charge control node Q2. The first discharge control node QB1 is charged by the second half-period clock signal CLKHB and the fourth clock signal CLK4. Meanwhile, the first discharge control node QB1 and the second discharge control node QB2 are charged once every four periods as can be seen from FIG. 11.

The half-period scanning pulse Hscp and the one-period scanning pulse Fscp generated by the shift register are converted by a level shifter (not shown) to have a swing width between the gate high voltage Vgh and the gate low voltage Vgl. Thereafter, the scanning pulses are sequentially applied, via the output buffer, to the gate lines G1 to Gn.

Figure 12:
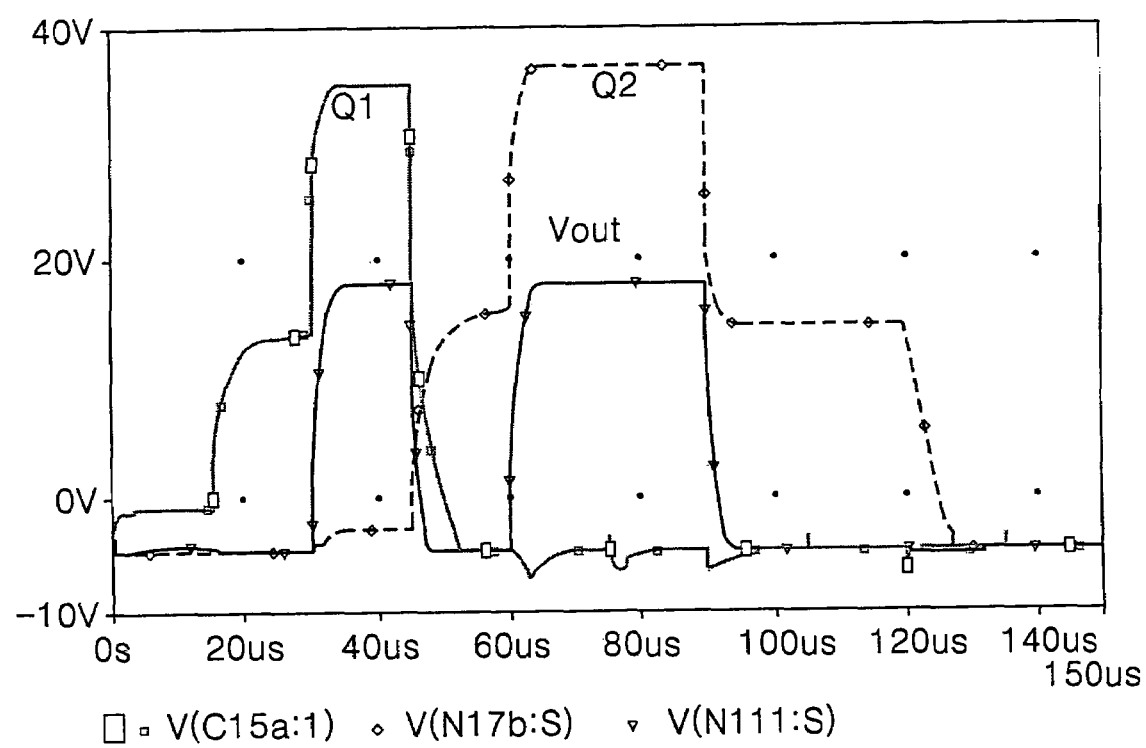
FIG. 12 depicts results of a simulation for verifying exemplary shift registers according to an embodiment of the present invention.

FIG. 12 depicts results of a simulation for verifying exemplary shift registers according to an embodiment of the present invention. As can be seen from FIG. 12, the gate driving apparatus according to the embodiment of the present invention can continuously generate the half-period scanning pulse and the one-period scanning pulse such that the scanning pulses have a half-period delay between them. In FIG. 12, the violet curve represents an output voltage Vout(i), and the red and green curves represent voltages at the first and second charge control nodes Q1 and Q2, respectively.

As described above, according to the present invention, a half-period output is generated and then an one-period output is generated at a half-period late time with the aid of two half-period clock signals having phases inverted with respect to each other and four clock signals having phases shifted sequentially. Accordingly, the half-period scanning pulse and the one-period scanning pulse are generated such that the scanning pulses have a half-period delay between them. Thus, a gate driving circuit suitable for a driving system capable of reducing the number of data lines as well as the number of data driving integrated circuits can be implemented.

It will be apparent to those skilled in the art that various modifications and variations can be made in the gate driving apparatus and method for liquid display of the present invention without departing from the spirit or scope of the invention. Thus, it is intended that the present invention cover the modifications and variations of the invention provided they come within the scope of the appended claims and their equivalents.

What is claimed is:

1. A gate driving apparatus for a liquid crystal display, comprising:
    a shift register provided with first and second half-period clock signals having phases inverted with respect to each other, first to fourth one-period clock signals having phases shifted sequentially and each having a pulse width of one period, a start pulse, a high-level supply voltage and a low-level supply voltage,
    wherein the shift register generates a half-period output in response to the start pulse and the first and second half-period clock signals, and generates a one-period output at a half-period delay from an end time of the half-period output in response to any one of the first to fourth one-period clock signals, and
    wherein each of the first and second half-period clock signals has a pulse width that is half of the pulse width of the first and fourth one-period clock signals.

2. The gate driving apparatus of claim 1, wherein the shift register includes a plurality of stages for generating the half-period output and the one-period output and further wherein the stages are connected in a cascade arrangement for sequentially shifting the half-period output and the one-period output.

3. The gate driving apparatus of claim 1, wherein any one of the first and second half-period clock signals, any one of the first to fourth one-period clock signals and the start pulse are synchronized with each other.

4. A gate driving apparatus for a liquid crystal display, comprising:
    a first input circuit for charging a first charge control node in response to a start pulse and a first half-period clock signal of first and second half-period clock signals having phases inverted with respect to each other and each having a half-period pulse width, and for charging a first discharge control node in response to the first half-period clock signal and a first clock signal of first to third clock signals having phases shifted sequentially and each having a one-period pulse width; and
    a first output circuit for outputting a half-period output to an output node in response to a control signal from the first charge control node and the second half-period clock signal, and for discharging the output node in response to a control signal from the first discharge control node,
    wherein each of the first and second half-period clock signals has a pulse width that is half of the pulse width of the first and fourth one-period clock signals.

5. The gate driving apparatus of claim 4, further comprising:
    a second input circuit for charging a second charge control node in response to the half-period output and the first half-period clock signal, and for charging the second charge control node in response to the second clock signal; and
    a second output circuit for outputting a one-period output to the output node at a half-period delay from an end time of the half-period output in response to a control signal from the second charge control node and the third clock signal, and for discharging the output node in response to a control signal from the second discharge control node.

6. The gate driving apparatus of claim 5, wherein the first input circuit, the first output circuit, the second input circuit and the second output circuit are included in each of a plurality of stages.

7. The gate driving apparatus of claim 6, wherein the start pulse is applied to the first stage of the plurality of stages.

8. The gate driving apparatus of claim 4, wherein the first half-period clock signal is synchronized with the second clock signal and the start pulse.

9. The gate driving apparatus of claim 4, wherein the first input circuit includes an inverter for charging the first charge control node at a half-period delay from the end time of the start pulse in response to the start pulse and the first half-period clock signal.

10. The gate driving apparatus of claim 9, wherein the inverter includes:
- a first transistor having a gate electrode and a drain electrode supplied with the start pulse;
- a second transistor having a gate electrode supplied with the second half-period clock signal and a source electrode supplied with a high-level supply voltage; and
- a third transistor having a gate electrode connected to a drain electrode of the first transistor, a source electrode connected to a drain electrode of the second transistor, and a drain electrode connected to the first charge control node.

11. The gate driving apparatus of claim 10, wherein the inverter further includes a capacitor for charging the start pulse to apply a gate voltage to the gate electrode of the third transistor.

12. The gate driving apparatus of claim 10, wherein the first input circuit includes:
- a fourth transistor having a gate electrode supplied with the fourth clock signal, a drain electrode supplied with a low-level supply voltage, and a source electrode connected to the gate electrode of the third transistor; and
- a fifth transistor having a drain electrode supplied with the low-level supply voltage, a gate electrode connected to the first discharge control node, and a source electrode connected to the first charge control node.

13. The gate driving apparatus of claim 4, wherein the first input circuit includes:
- a sixth transistor having a gate electrode supplied with the fourth clock signal and a source electrode supplied with a high-level supply voltage; and
- a seventh transistor having a gate electrode supplied with the second half-period clock signal, a source electrode connected to a drain electrode of the sixth transistor, and a drain electrode connected to the first discharge control node.

14. The gate driving apparatus of claim 4, wherein the first input circuit includes:
- an eighth transistor having a gate electrode supplied with the start pulse, a drain electrode supplied with a low-level supply voltage, and a source electrode connected to the first discharge control node; and
- a ninth transistor having a drain electrode supplied with a low-level supply voltage, a gate electrode connected to the output node and a source electrode connected to the first discharge control node.

15. The gate driving apparatus of claim 6, wherein the first output circuit includes:
- a tenth transistor having a source electrode supplied with the first half-period clock signal, a drain electrode connected to the output node, and a gate electrode connected to the first charge control node;
- an eleventh transistor having a drain electrode supplied with a low-level supply voltage, a source electrode connected to the output node, and a gate electrode connected to the first discharge control node; and
- a twelfth transistor having a source electrode supplied with the first half-period clock signal, a gate electrode connected to the first charge control node, and a drain electrode connected to a start pulse input terminal of the next stage.

16. The gate driving apparatus of claim 5, wherein the second input circuit includes an inverter for charging the second charge control node at a half-period delay from the end time of the half-period output in response to the half-period output and the first half-period clock signal.

17. The gate driving apparatus of claim 16, wherein the inverter includes:
- a thirteenth transistor having a source electrode supplied with a high-level supply voltage and a gate electrode connected to the output node;
- a fourteenth transistor having a source electrode supplied with the high-level supply voltage and a gate electrode supplied with the second half-period clock signal; and
- a fifteenth transistor having a gate electrode connected to a source electrode of the thirteenth transistor, a source electrode connected to a drain electrode of the fourteenth transistor, and a drain electrode connected to the second charge control node.

18. The gate driving apparatus of claim 17, wherein the inverter further includes a capacitor for charging the high-level supply voltage to apply a gate voltage to the gate electrode of the fifteenth transistor.

19. The gate driving apparatus of claim 17, wherein the second input circuit includes:
- a sixteenth transistor having a gate electrode supplied with the first clock signal, a drain electrode supplied with a low-level supply voltage, and a source electrode connected to the drain electrode of the thirteenth transistor and the gate electrode of the fifteenth transistor; and
- a seventeenth transistor having a drain electrode supplied with the low-level supply voltage, a gate electrode connected to the second discharge control node, and a source electrode connected to the drain electrode of the fifteenth transistor and the second charge control node.

20. The gate driving apparatus of claim 5, wherein the second input circuit includes:
- an eighteenth transistor having a gate electrode and a source electrode supplied with the third clock signal and a drain electrode connected to the second discharge control node;
- a nineteenth transistor having a drain electrode supplied with a low-level supply voltage, a gate electrode connected to the output node, and a source electrode connected to the second discharge node; and
- a twentieth transistor having a drain electrode supplied with the low-level supply voltage, a gate electrode connected to the second charge control node, and a source electrode connected to the second discharge control node.

21. The gate driving apparatus of claim 5, wherein the second output circuit includes:
- a twenty-first transistor having a source electrode supplied with the first clock signal, a gate electrode connected to the second charge control node, and a drain electrode connected to the output node; and
- a twenty-second transistor having a drain electrode supplied with a low-level supply voltage, a gate electrode connected to the second discharge control node, and a source electrode connected to the output node.

22. A gate driving method for a liquid crystal display, comprising the steps of:
- receiving first and second half-period clock signals having phases inverted with respect to each other and each having a half-period of pulse width, first to fourth one-period clock signals having phases shifted sequentially and each having a pulse width of one period, a start pulse, a high-level supply voltage and a low-level supply voltage; and
- generating a half-period output in response to the start pulse and the first and second half-period clock signals, and generating an one-period output at a half-period delay from the end time of the half-period output in response to any one of the first to fourth one-period clock signals, and wherein each of the first and second half-period clock signals has a pulse width that is half of the pulse width of the first and fourth one-period clock signals.

23. The gate driving method of claim 22, wherein any one of the first and second half-period clock signals, any one of the first to fourth one-period clock signals and the start pulse are synchronized with each other.

24. A gate driving method for a liquid crystal display, comprising the steps of:

charging a first charge control node in response to a start pulse and a first half-period clock signal of first and second half-period clock signals having phases inverted with respect to each other and each having a half-period pulse width;

outputting an half-period output to an output node in response to a control signal from the first charge control node and the first half-period clock signal;

charging a first discharge control node in response to the second half-period clock signal and a first clock signal of first to third clock signals having phases shifted sequentially and each having an one-period pulse width;

discharging the output node in response to a control signal from the first discharge control node;

charging the second charge control node in response to the half-period output and the second half-period clock signal;

charging the second discharge control node in response to the second clock signal;

outputting a one-period output to the output node at a half-period delay from an end time of the half-period output in response to a control signal from the second charge control node and the third clock signal; and discharging the output node in response to a control signal from the second discharge control node, wherein each of the first and second half-period clock signals has a pulse width that is half of the pulse width of the first and fourth one-period clock signals.

25. The gate driving method of claim 24, wherein the first half-period clock signal, the second clock signal, and the start pulse are synchronized with each other.

* * * * *